United States Patent
Ogihara

(10) Patent No.: US 7,642,134 B2
(45) Date of Patent: Jan. 5, 2010

(54) SEMICONDUCTOR DEVICE, MANUFACTURING METHOD OF SEMICONDUCTOR DEVICE, MANUFACTURING EQUIPMENT OF SEMICONDUCTOR DEVICE, LIGHT EMITTING DIODE HEAD, AND IMAGE FORMING APPARATUS

(75) Inventor: Mitsuhiko Ogihara, Tokyo (JP)

(73) Assignee: Oki Data Corporation, Tokyo (JP)

( * ) Notice: Subject to any disclaimer, the term of this patent is extended or adjusted under 35 U.S.C. 154(b) by 112 days.

(21) Appl. No.: 11/737,257

(22) Filed: Apr. 19, 2007

(65) Prior Publication Data

US 2007/0249178 A1    Oct. 25, 2007

(30) Foreign Application Priority Data

Apr. 24, 2006 (JP) .............................. 2006-119645

(51) Int. Cl.
*H01L 21/302* (2006.01)

(52) U.S. Cl. ..................... 438/110; 438/706; 438/689

(58) Field of Classification Search ................. 438/689, 438/753, 745, 749, 460, 464, 74
See application file for complete search history.

(56) References Cited

U.S. PATENT DOCUMENTS

| 5,597,766 | A | * | 1/1997 | Neppl ........................ 438/460 |
| 5,851,928 | A | * | 12/1998 | Cripe et al. .................. 438/748 |
| 6,294,439 | B1 | * | 9/2001 | Sasaki et al. ................. 438/464 |
| 2004/0038533 | A1 | * | 2/2004 | Liang .......................... 438/689 |
| 2004/0192045 | A1 | * | 9/2004 | Leedy ......................... 438/689 |
| 2005/0208727 | A1 | * | 9/2005 | Lin et al. ..................... 438/386 |
| 2006/0003551 | A1 | * | 1/2006 | Mancini et al. ............. 438/462 |
| 2006/0068567 | A1 | * | 3/2006 | Beyne et al. ................ 438/460 |
| 2006/0079024 | A1 | * | 4/2006 | Akram ....................... 438/110 |

FOREIGN PATENT DOCUMENTS

JP         08-032110         2/1996

* cited by examiner

*Primary Examiner*—Thomas L Dickey
*Assistant Examiner*—Nikolay Yushin
(74) *Attorney, Agent, or Firm*—Panitch Schwarze Belisario & Nadel LLP

(57) ABSTRACT

A manufacturing method of a semiconductor device is provided to manufacture an increased number of semiconductor devices per single substrate such as, e.g., a wafer while obviating damages like those caused by conventional dicing method. The manufacturing method comprises steps of performing a first etching process to etch a separation area on a front surface of a substrate, arranging a supporter on a back surface of the first substrate to prevent semiconductor devices from coming apart, coating with a thin film a non-etching area including a sidewall of the etched separation area and excluding a bottom of the etched separation area on the front surface of the first substrate, and performing a second etching process to etch the first substrate from the front surface through an area not coated by the thin film to divide the substrate into multiple semiconductor devices.

8 Claims, 19 Drawing Sheets

SEMICONDUCTOR DEVICE, MANUFACTURING METHOD OF SEMICONDUCTOR DEVICE, MANUFACTURING EQUIPMENT OF SEMICONDUCTOR DEVICE, LIGHT EMITTING DIODE HEAD, AND IMAGE FORMING APPARATUS

BACKGROUND OF THE INVENTION

1. Field of the Invention

This invention generally relates to devices and methods such as a semiconductor device formed by dividing a semiconductor element area formed on a substrate and a manufacturing method of the semiconductor device. This invention more particularly relates to a semiconductor device separated from another semiconductor device under the use of etching technology, a manufacturing method of the semiconductor device, a manufacturing equipment of the semiconductor device, a light emitting diode head, and an image forming apparatus.

2. Description of Related Art

There has been conventionally known a dicing method for separating multiple semiconductor devices formed on a semiconductor wafer into individual semiconductor devices (chips). In the dicing method, the wafer is cut by the dicing blade which adversely impacts the wafer, and such an impact is likely to chip end portions of the semiconductor device, namely, to cause chipping. In order to prevent such chipping, an area wider than a width actually being cut is reserved as a cutting area. Japanese Patent Application Publication No. H08-32110 discloses such method for dicing LED array chips used for an exposure device (LED head) of an image forming apparatus making use of an electrophotographic technology such as, e.g., a printer.

There exists a problem that the above-mentioned dicing method requires a relatively large area between semiconductor devices to adversely limit the number of semiconductor devices made from a single semiconductor wafer.

This invention is made to solve such problems, and it is an object to provide a semiconductor device and a manufacturing method of the semiconductor device that can produce more semiconductor devices from a single wafer such as, e.g., a semiconductor wafer while obviating damages like those caused by the dicing process.

BRIEF SUMMARY OF THE INVENTION

To solve such problems, the present invention provides a semiconductor device comprising a semiconductor element area arranged on a first substrate, wherein an etching process etches at least a portion of the first substrate to separate the semiconductor device from another neighboring semiconductor device. The present invention surely reduces occurrence of chipping by employing the required etching process as a separation method between devices instead of the conventional dicing process.

In preferred embodiments of this invention, an anisotropic dry etching process, an isotropic dry etching process, a wet etching process, and the like can be employed as an etching process, and the semiconductor device can be separated from another neighboring semiconductor device by the etching process penetrating the first substrate from the front surface to the back surface thereof. The substrate can employ various kinds of material such as, e.g., a semiconductor substrate, such as, e.g., silicon substrate, GaAs substrate, and InP substrate, and a Silicon On Insulator (SOI) substrate.

To solve such problems, the present invention provides a manufacturing method of a semiconductor device in which a first substrate comprising a semiconductor element area is divided into a plurality of semiconductor devices, the manufacturing method comprising steps of performing a first etching process to etch a separation area on a front surface of the first substrate, arranging a supporter on a back surface of the first substrate to prevent the plurality of semiconductor devices from coming apart after the first substrate is divided, coating with a thin film a non-etching area including a sidewall of the etched separation area and excluding an aperture area on a bottom of the etched separation area on the front surface of the first substrate, and performing a second etching process to etch the front surface of the first substrate through the aperture area as an etching window to penetrate the first substrate.

The present invention further provides a manufacturing method of a semiconductor device in which a first substrate comprising a semiconductor element area is divided into a plurality of semiconductor devices, the manufacturing method comprising steps of performing a first etching process to etch a separation area on a front surface of the first substrate, coating with a thin film a non-etching area including a sidewall of the etched separation area and excluding an aperture area on a bottom of the etched separation area on the front surface of the first substrate, performing a second etching process to etch the front surface of the first substrate through the aperture area as an etching window, arranging a supporter on the front surface of the first substrate to prevent the plurality of semiconductor devices from coming apart after the first substrate is divided, and grinding a back surface of the first substrate to cause a hollow portion etched by the first and second etching process to penetrate through the front surface to the back surface of the first substrate.

The present invention further provides a manufacturing method of a semiconductor device in which a first substrate comprising a semiconductor element area is divided into a plurality of semiconductor devices, the manufacturing method comprising steps of performing a first etching process to etch a separation area on a front surface of the first substrate, coating with a thin film a first non-etching area on a back surface of the first substrate excluding a first aperture area corresponding to the etched separation area, performing a second etching process to etch the back surface of first substrate through the first aperture area as an etching window, arranging a supporter on the back surface of the first substrate to prevent the plurality of semiconductor devices from coming apart after the first substrate is divided, coating with a thin film a second non-etching area on the front surface of the first substrate including a sidewall of the etched separation area and excluding a second aperture area on a bottom of the etched separation area, and performing a third etching process to etch the front surface of the first substrate through the second aperture area as an etching window to penetrate the first substrate.

The semiconductor device according to the present invention surely reduces occurrence of chipping by employing the etching process as a separation method between devices instead of the conventional dicing method. Therefore, the present invention is capable of making smaller a margin area for chipping around the semiconductor device, and making higher a ratio of an area in which the semiconductor devices can be formed to an area for manufacturing step, and thereby, the present invention increases the number of devices that can be manufactured.

With the manufacturing method of the semiconductor device according to the present invention, a combination of etching processes can surely divide the semiconductor element area for each of the semiconductor devices, a cutting width can be narrowed and controlled more precisely compared with the dicing method, and the etching process gives less mechanical damages to the substrate. Therefore, the manufacturing method according to the present invention is especially highly effective in a case of attempting to make finer elements.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Particular embodiments of a semiconductor device and a manufacturing method of the semiconductor device according to this invention is hereinafter described in details with reference to the figures.

First Embodiment

The first embodiment discloses a manufacturing method of a semiconductor device with the use of a silicon wafer. The first embodiment is especially advantageous for forming many semiconductor light emitting elements, such as, e.g., LED array chips, at a time.

Figure 2:
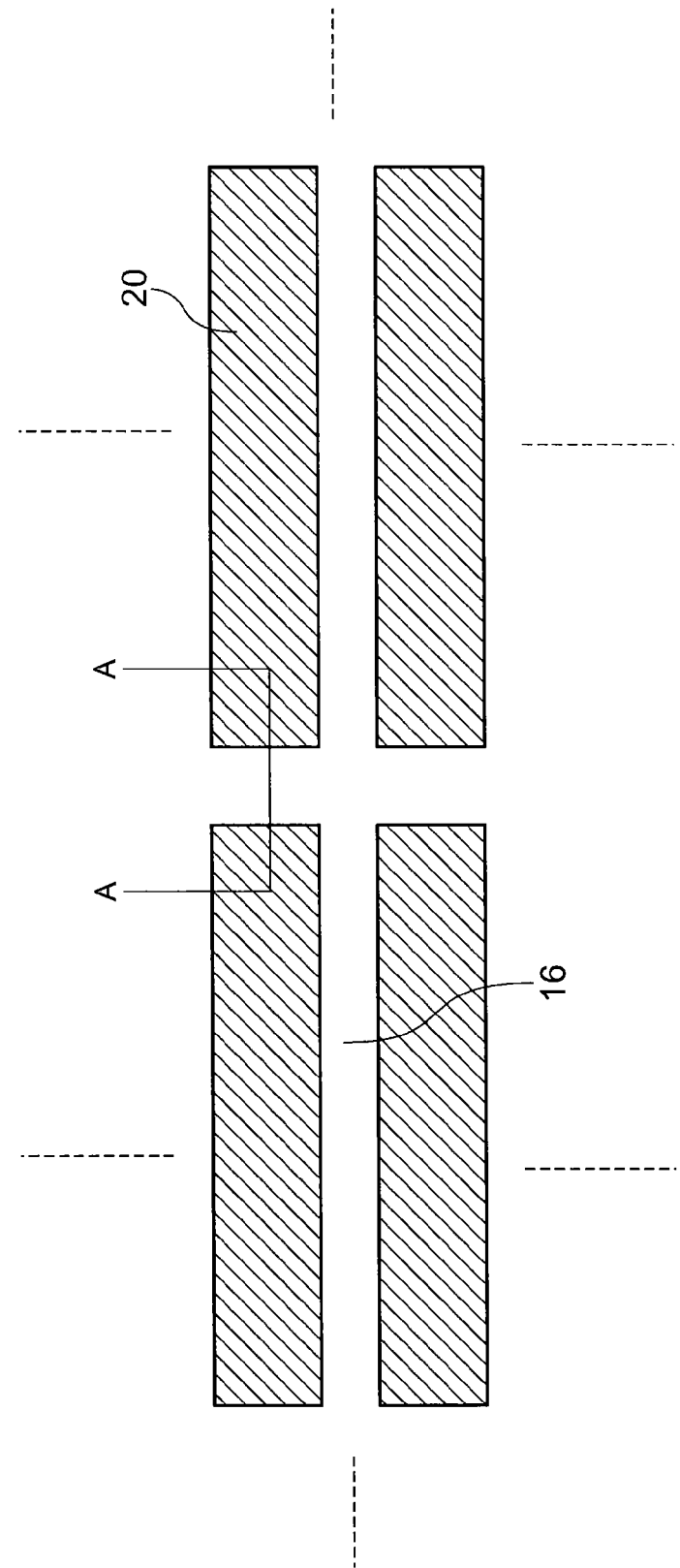
FIG. 2 is a top view showing an arrangement of the semiconductor device according to the manufacturing method of the semiconductor device of the first embodiment of this invention.

In the first embodiment, semiconductor element areas 20 each in a rectangular shape are formed to line up in a lateral and longitudinal direction as shown in FIG. 2. Each of the semiconductor element areas 20 in a rectangular shape are formed on a silicon substrate 11, namely, a semiconductor wafer. An area between the semiconductor element areas 20 in a rectangular shape is a separation area 16 that is to be etched for separating the semiconductor element areas 20 into individual devices. Particularly in the first embodiment, the separation area 16 is a belt-like area extending in a grid.

Figure 1:
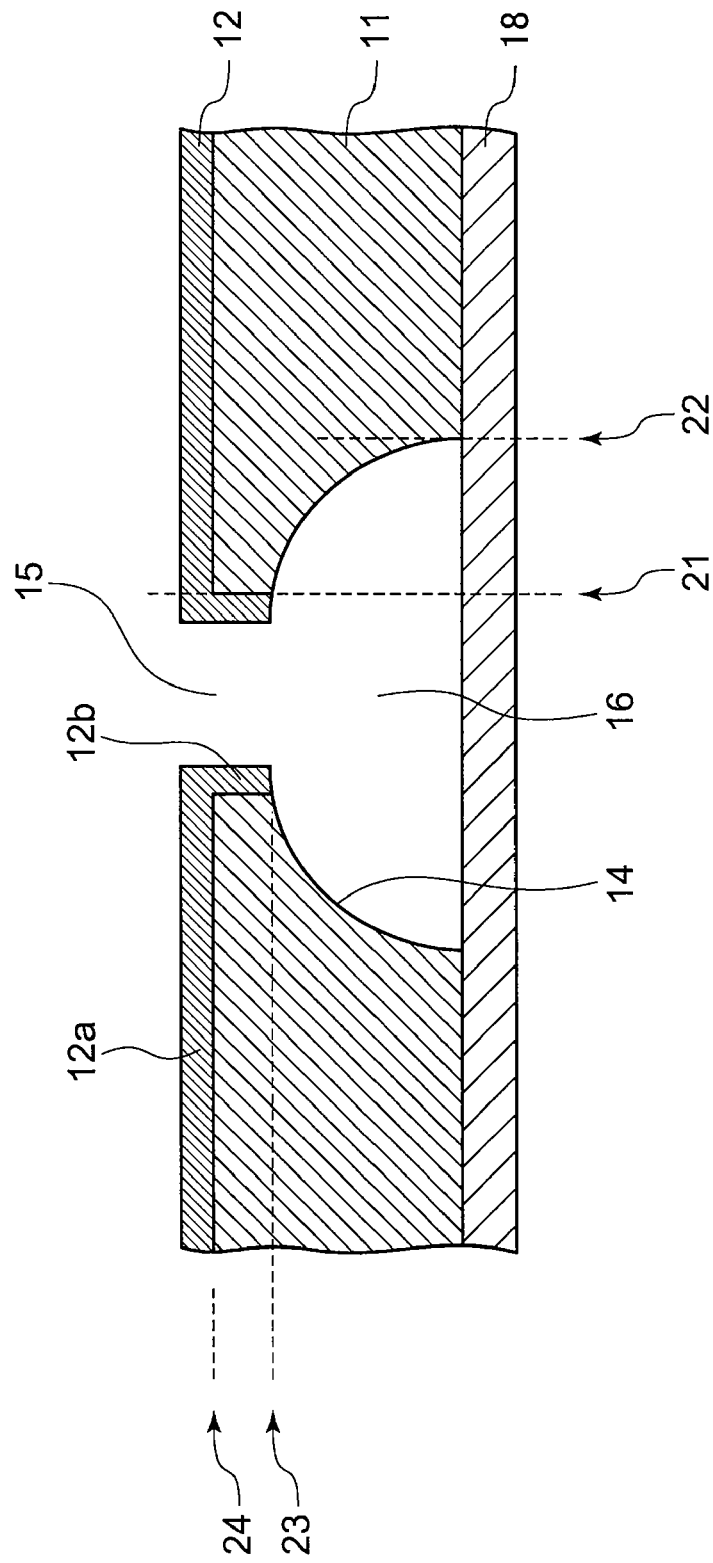
FIG. 1 is a diagram showing a process of separating semiconductor devices through an etching process according to the manufacturing method of the semiconductor device of the first embodiment of this invention.

After a required semiconductor device has been formed, namely, for example, an electrode layer, an active layer, and the like have been formed on the semiconductor element areas 20 formed on the silicon substrate 11, the silicon wafer is divided into the semiconductor element areas 20 as shown in FIG. 1. First, a masking material layer is applied to cover an entire surface of the silicon substrate 11 including the separation area 16 that is to be etched. Then, the masking material is removed in the separation area 16 to reveal the surface of the semiconductor wafer that is to be etched to form a window portion. The masking martial can employ, for example, one of organic material, silicon oxide, silicon nitride, or metal material, or a combination thereof. It is preferable that the masking material layer 12 remain as a layer of a ultimate device.

Subsequently, a first dry etching process etches the separation area 16 of the silicon substrate 11 from a surface 24 to a certain etched depth 23. At this moment, the etched depth 23 should be, for example, 5 micrometers or more. The etched depth can be shallower as needed on condition that the etched depth does not affect the device. A sidewall of an etched area is preferred to be perpendicular to the surface of the wafer in a cross section thereof, and therefore, an anisotropic etching process is preferred that does not etch in a direction parallel to the surface of the wafer. Radio frequency dry etching process using $SF_6$ and $O_2$ gas as etching gas can be employed in the dry etching process.

The masking material layer 12 is applied to cover a surface 12a and an etched sidewall 12b. However, an area that is to be the separation area 16, i.e., a bottom surface of an etched area 15 in the certain etched depth 23, is left uncovered.

Figure 3:
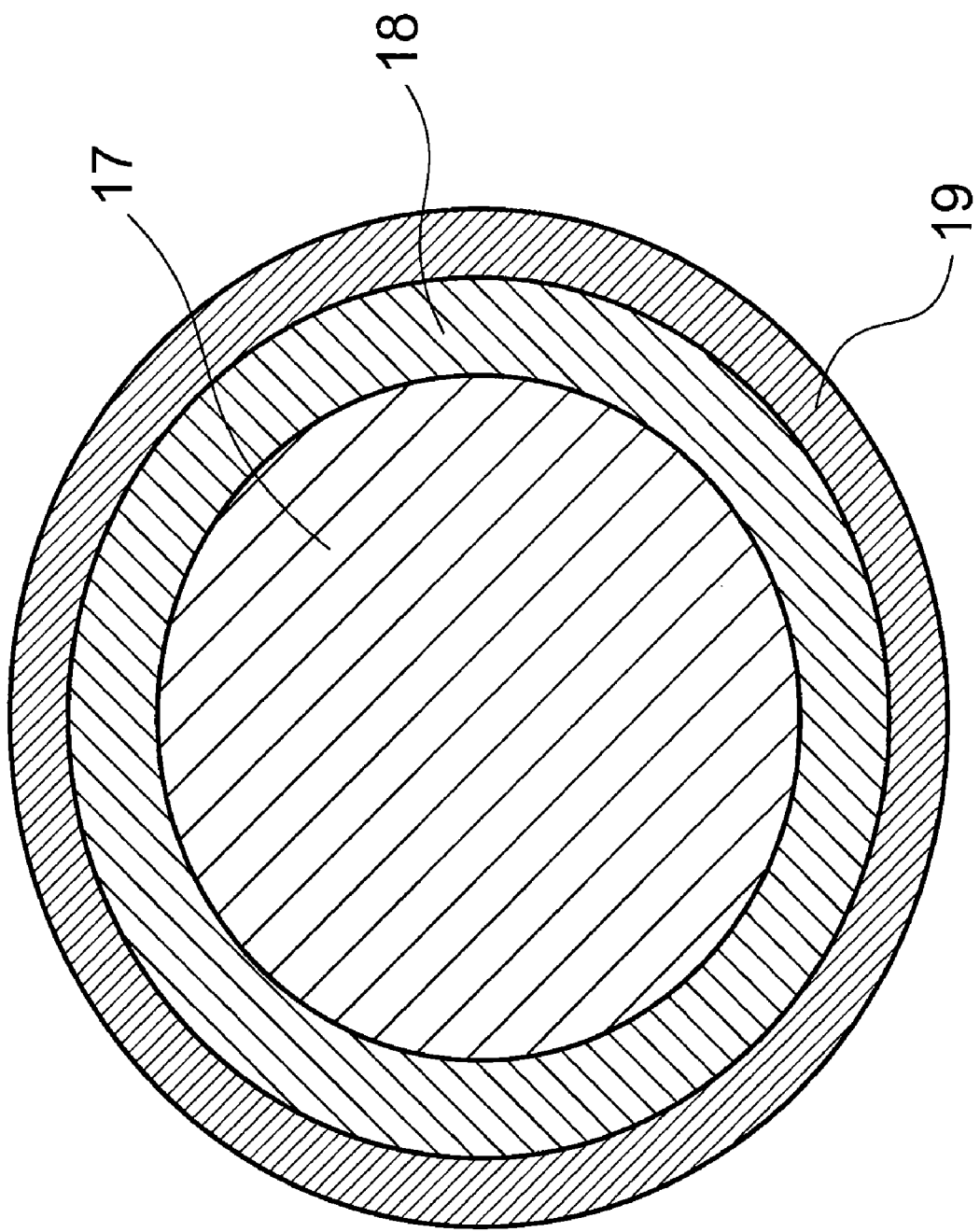
FIG. 3 is a top view showing an adhesion step of a semiconductor wafer according to the manufacturing method of the semiconductor device of the first embodiment of this invention.
Figure 4:
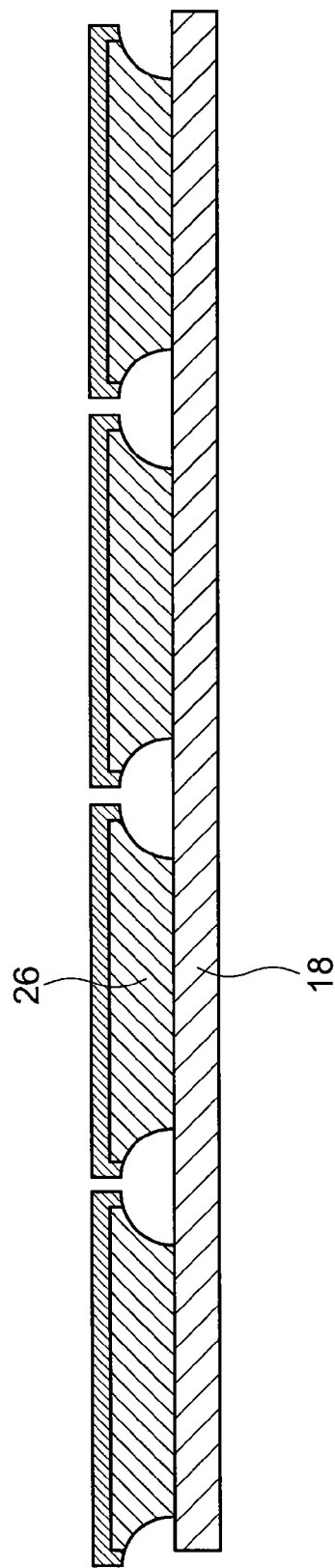
FIG. 4 is a cross section of the wafer before the wafer is divided into the semiconductor devices according to the manufacturing method of the semiconductor device of the first embodiment of this invention.

Subsequently, as shown in FIG. 3, a wafer 17 (namely, the silicon substrate 11) is adhesively fixed to a fixation frame 19 with the use of an adhesive sheet 18 as a supporter so as to prevent each of the semiconductor devices from being separated after a following second dry etching process.

After the wafer 17 is fixed to the fixation frame 19, the second dry etching process is performed. The second dry etching process employs an isotropic dry etching process in order to increase an etching rate in a depth direction. Where a silicon substrate 11 is thin, namely, for example, the thickness of the silicon substrate 11 is 50 micrometers or less, an etching process that is the same as the first etching process (the anisotropic etching process) can be performed again instead. The second dry etching process may employ radio frequency dry etching process using $SF_6$ and $O_2$ gas as etching gas. The second dry etching process is performed to render the cross section of an etched sidewall 14, for example, substantially in a dome shape as shown in FIG. 1. The adhesive sheet 18 previously adhered is exposed at the bottom of the separation area 16.

The second dry etching process extends an etched area edge 22 on the bottom of the wafer toward the devices from an etched area edge 21 of the first dry etching process. Therefore, the semiconductor element areas are separated by only a width etched by the anisotropic etching process capable of performing precise etching, and thus the semiconductor device is adequately separated from a neighboring semiconductor device even where the semiconductor devices are arranged in high density.

After completing the second dry etching process, each of device chips 26, namely, semiconductor devices, is held by the adhesive sheet 18. In a subsequent step, each of the device chips 26 is removed from the adhesive sheet 18 to become an individual microscopic chip respectively.

The manufacturing method according the first embodiment employs a process in which the isotropic dry etching process and the anisotropic dry etching process are performed in combination after an element formation portion of the semiconductor devices are made, thus providing high spatial precision defined in a wafer process, freeing finished separated edges from defects such as, e.g., chipping, and obviating mechanical damages affecting the devices. Furthermore, the first embodiment can also be applied to thick substrates since the first embodiment forms the separation area fast with the use of the isotropic etching process having a high etching rate. The first embodiment prevents the semiconductor devices from being contaminated since the first embodiment does not use cutting method such as, e.g., dicing.

Second Embodiment

Figure 5:
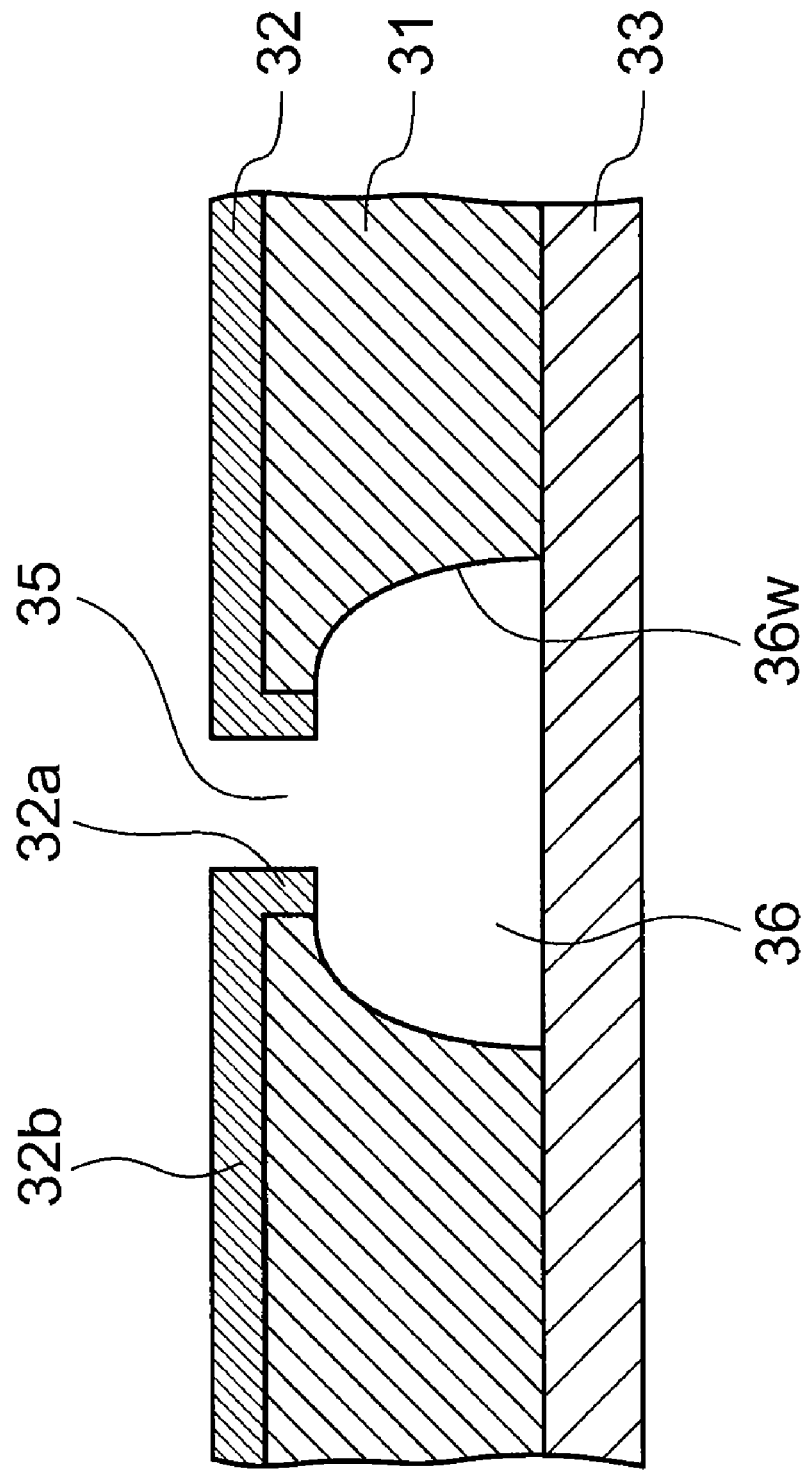
FIG. 5 is a cross section of the wafer before the wafer is divided into the semiconductor devices according to the manufacturing method of the semiconductor device of the second embodiment of this invention.

FIG. 5 is a diagram showing a cross section of the wafer after the separation area has been etched through the manufacturing method according to the second embodiment and before each of the devices is separated. The masking material layer 32 is formed on the surface of a silicon substrate 31. Then, with the help of the masking material layer 32, an aperture area 35 of a narrow width is formed from a surface 44 to a depth 43 in a same manner as the first embodiment. On a sidewall of the aperture area 35, a sidewall protection layer 32a is formed to incorporate with the surface 32b.

Below the narrow aperture area 35, a hollow space 36 (separation area) in a dome shape is formed through the isotropic etching process. A larger amount of the wafer is removed in a hollow space 36 than in the aperture area 35, and thus a sidewall 36w in the hollow space 36 is in a shape further etching the wafer than the width of the aperture area 35.

Figure 6:
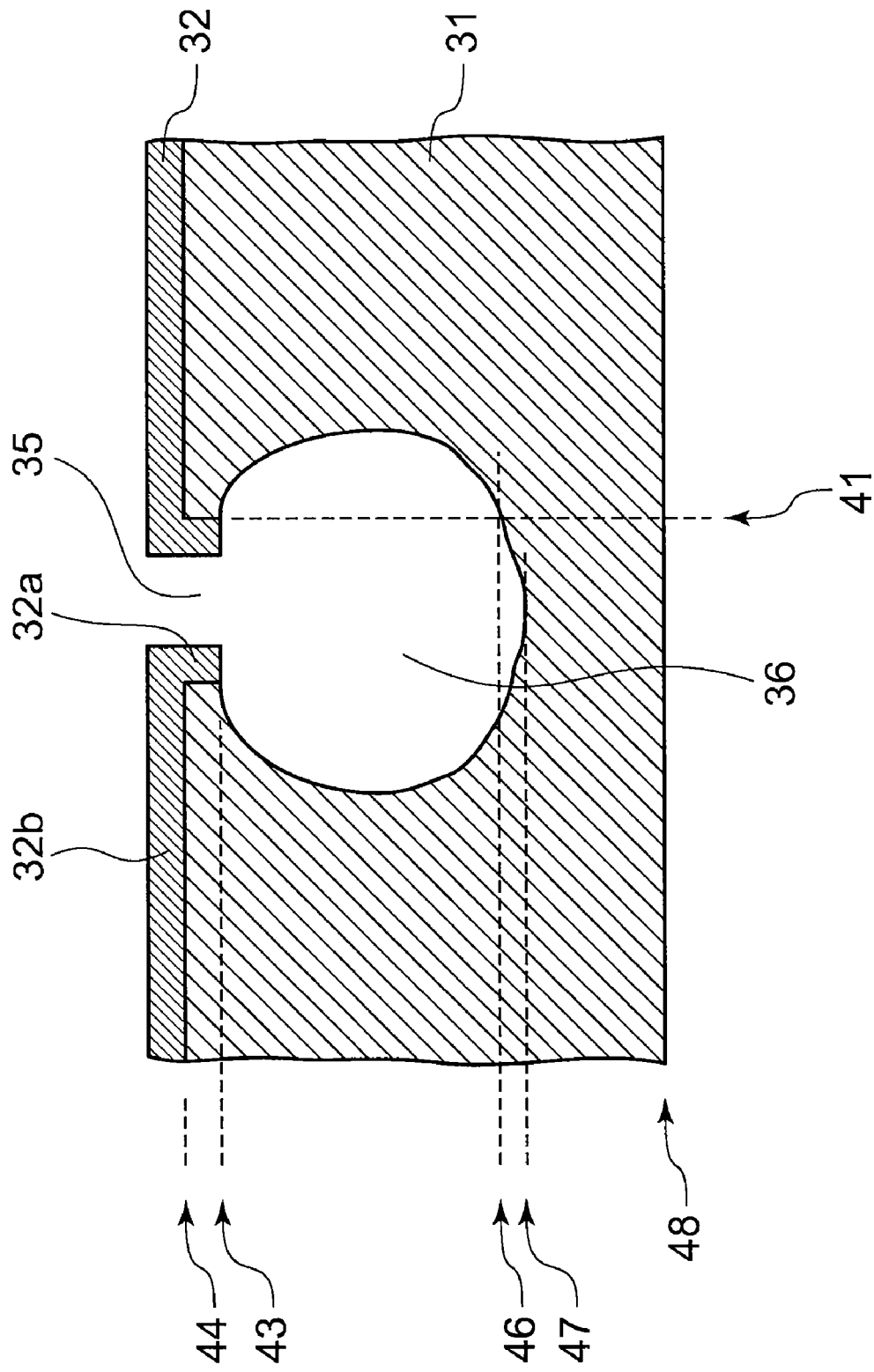
FIG. 6 is a cross section of the wafer after the isotropic etching process has been performed according to the manufacturing method of the semiconductor device of the second embodiment of this invention.
Figure 7:
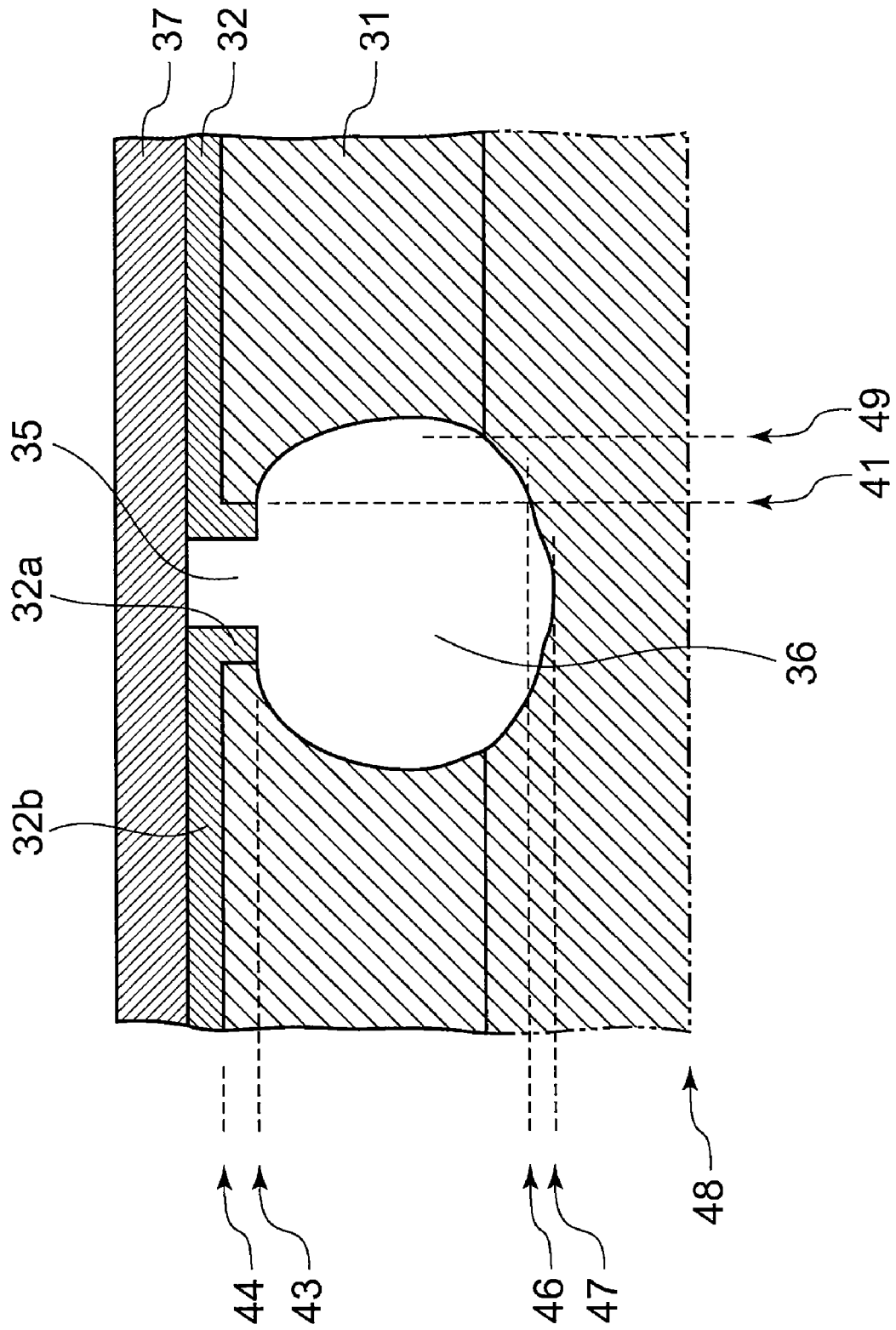
FIG. 7 is a cross section of the wafer after the adhesion sheet has been pasted according to the manufacturing method of the semiconductor device of the second embodiment of this invention.
Figure 8:
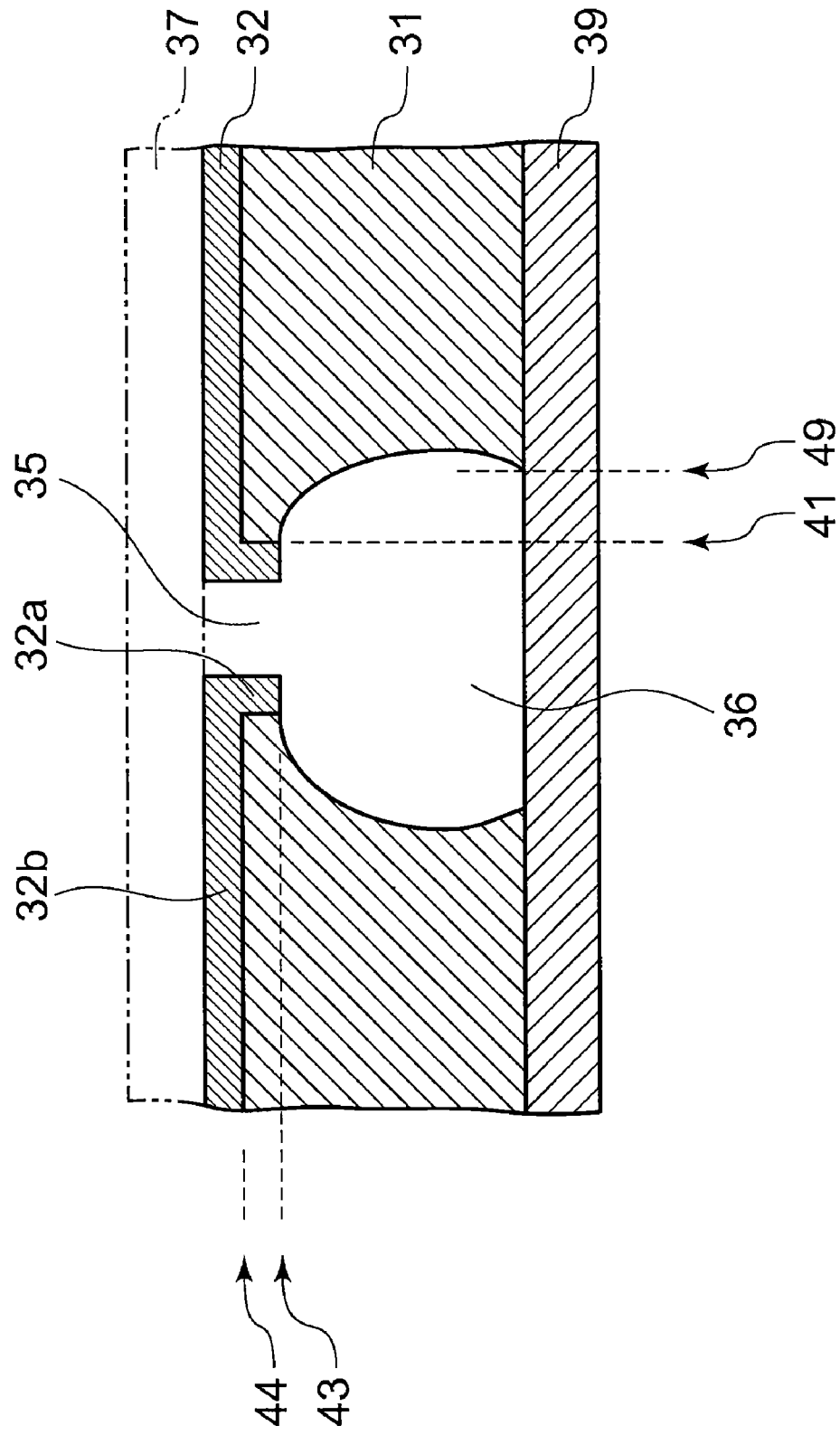
FIG. 8 is a cross section of the wafer after the back surface of the wafer has been grinded according to the manufacturing method of the semiconductor device of the second embodiment of this invention.

In order to obtain the above-mentioned structure, following steps shown in FIG. 6 through FIG. 8 are performed. First, as shown in FIG. 6, the anisotropic etching process etches an area that is to be the aperture area 35 from the surface 44 to the depth 43. The anisotropic etching process described in the first embodiment can be employed.

Subsequently, the isotropic etching process etches to the depth 47. The depth 47 should be shallower than the thickness (a back surface 48) of the silicon substrate 31, that is, the isotropic etching process should be stopped at an extent in which the substrate is not penetrated from the front surface to the back surface. As the isotropic etching process, a method described in the first embodiment can be employed. The isotropic etching process forms the hollow portion 36 whose bottom is deeper than the depth 46 at the point straightly below the edge for the aperture area 35, and the horizontal width of the hollow portion 36 is wider than the aperture area 35.

Subsequently, as shown in FIG. 7, a chip fixation sheet 37 is pasted on the front surface, and the back surface 48 of the silicon substrate 31 is grinded until the hollow portion 36 is revealed. The grinding results in exposing the hollow portion 36 extended horizontally by the previous etching process, and an aperture area 49 of the exposed hollow portion 36 is made to further advance toward the semiconductor elements than the edge 41 (namely, the width of the aperture area 35).

Subsequently, as shown in FIG. 8, an adhesive sheet 39 for fixation is pasted on the back surface, and the sheet 37 on the front surface is removed. Alternatively, the chips can also be directly removed from the sheet 37 without the adhesive sheet 39 pasted instead of the sheet 37.

In the second embodiment, the back surface 48 of the wafer is grinded after the second dry etching process is performed so as to reveal the hollow portion 36, namely, an etched portion, from the back side. Thus, even where the silicon substrate 31 is thick, the semiconductor devices can be separated into each of individual devices without requiring as much etching amount as in the etching process for penetrating the entire thickness of the wafer. Therefore, the manufacturing method according to the second embodiment shortens an etching time and reduces a horizontal extension of the hollow portion more than necessary, thus improving the size reproducibility.

Third Embodiment

Figure 9:
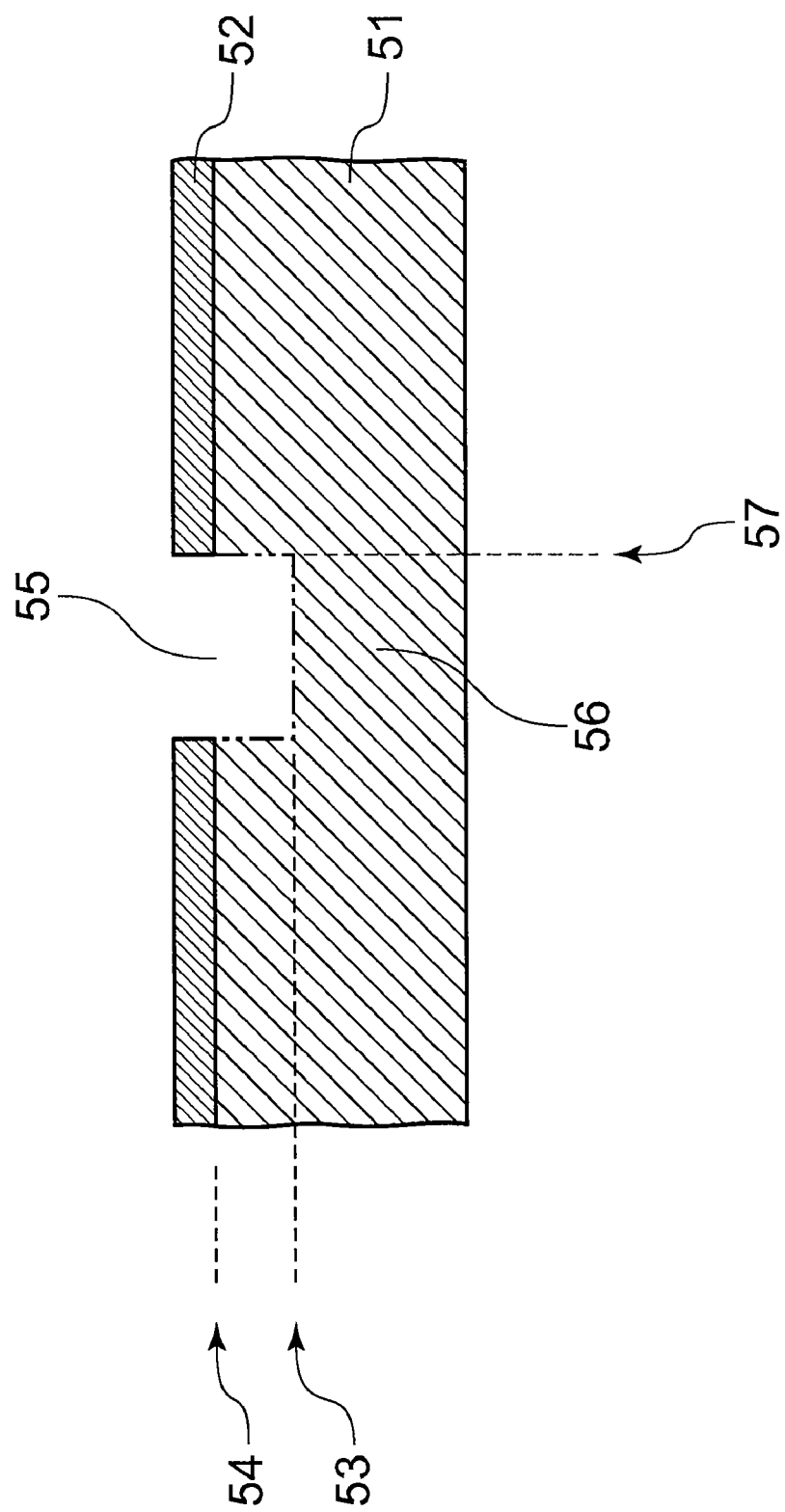
FIG. 9 is a cross section of the wafer after the first etching process has been performed according to the manufacturing method of the semiconductor device of the third embodiment of this invention.
Figure 10:
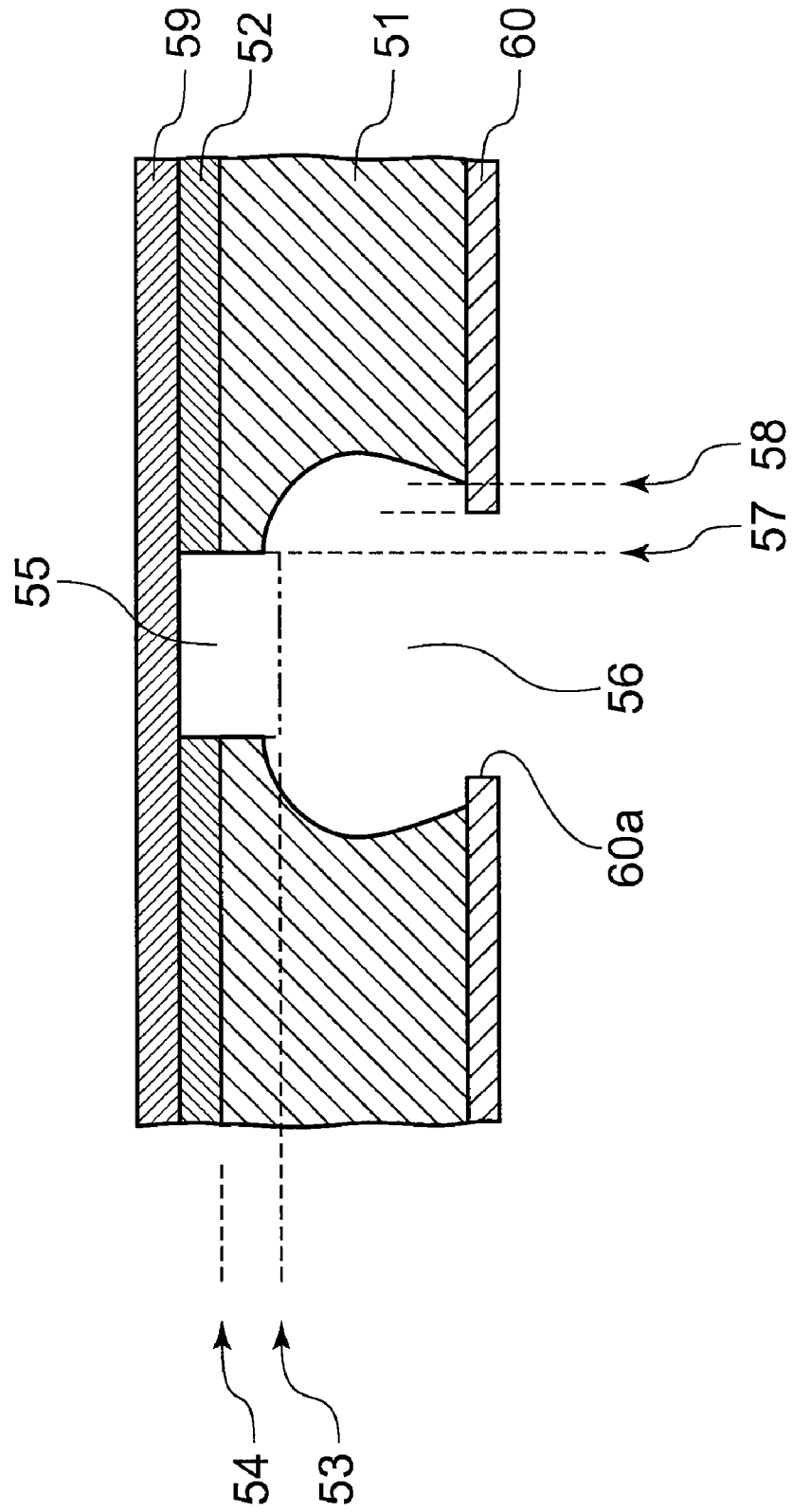
FIG. 10 is a cross section of the wafer after the second etching process has been performed according to the manufacturing method of the semiconductor device of the third embodiment of this invention.

FIG. 9 and FIG. 10 are cross sections of the wafer showing steps of the manufacturing method of the semiconductor device according to the third embodiment of this invention. First, as shown in FIG. 9, a masking material layer 52 is formed on a silicon substrate 51 except a separation area 56 that is to be left uncovered. Then, the anisotropic etching process forms an aperture area 55 at a location corresponding to the location of the separation area 56 from a surface 54 to a depth 53. The anisotropic etching process forms a substantially vertical sidewall on an edge position 57 of the aperture area 55.

Subsequently, as shown in FIG. 10, a second masking material layer 60 is formed on the back surface of the substrate except the separation area 56, namely, an area that is to be etched to form an etching aperture area 60a on the back surface of the wafer. After forming the etching aperture area 60a as mentioned above on the second masking material layer 60, a chip fixation sheet 59 is pasted on the front of the wafer. After the chip fixation sheet 59 is pasted to adhere each of the semiconductor devices to prevent the devices from scattering, the isotropic etching process etches the wafer from the back surface through the etching aperture area 60a to form the hollow portion 56. The isotropic etching process may etch the wafer to a depth reaching a bottom 53 made by the first dry etching process, and the isotropic etching process can etch the wafer to expand the hollow portion 56 to a position 58 further extended horizontally from an edge position 57 of the aperture area 55.

In the manufacturing method according to the third embodiment as hereinabove described, the second dry etching process is performed from the back surface of the substrate to manufacture the devices with highly precise size reproducibility while reducing influence of the horizontal etching amount of the separation area on the surface of the wafer.

Fourth Embodiment

Figure 11:
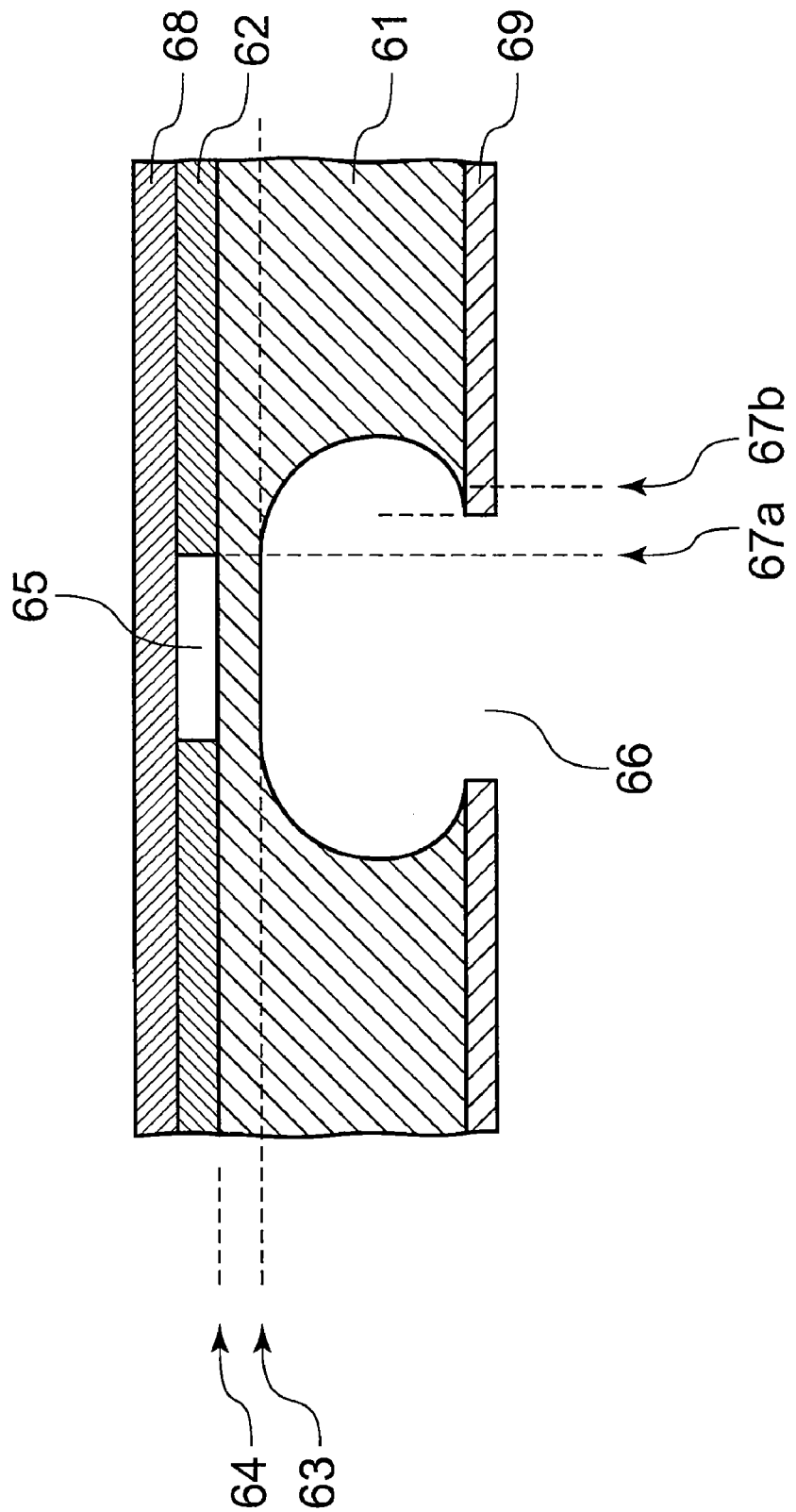
FIG. 11 is a cross section of the wafer after the isotropic etching process has been performed according to the manufacturing method of the semiconductor device of the fourth embodiment of this invention.
Figure 12:
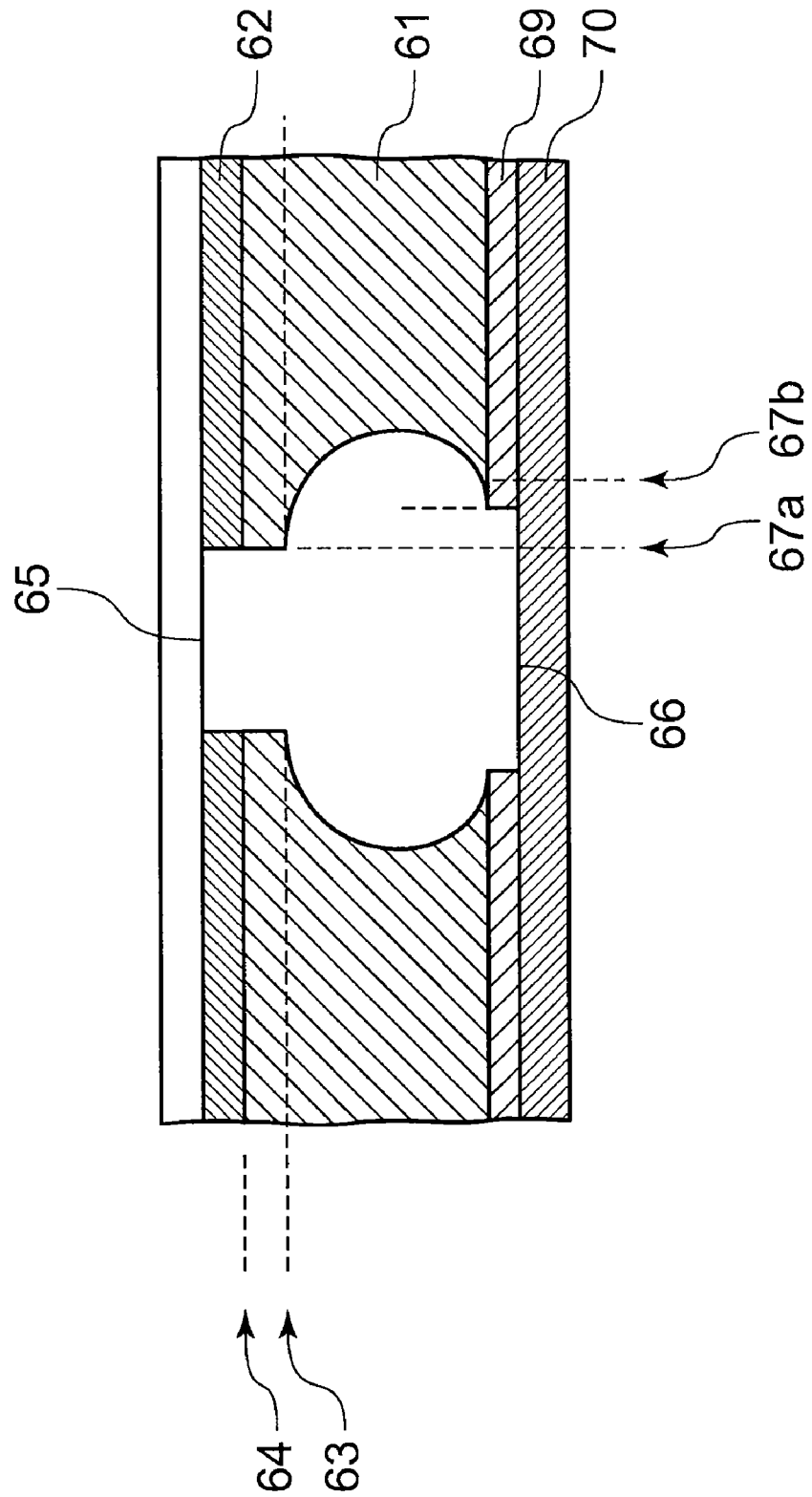
FIG. 12 is a cross section of the wafer after the anisotropic etching process has been performed according to the manufacturing method of the semiconductor device of the fourth embodiment of this invention.

FIG. 11 and FIG. 12 are figures showing the manufacturing method of the semiconductor device according to the fourth embodiment of this invention. In a same manner as the previous embodiments, a masking material layer 62 is formed on the silicon substrate 61 except an area corresponding to a hollow portion 66 (a separation area ) that is to be left uncovered, and then the anisotropic dry etching process, namely, the first dry etching process, etches the separation area 66 from a surface 64 to a depth 63 to form an aperture area 65 corresponding to the separation area 66. After completing the first dry etching process, a masking material layer 69 for etching is formed on the back surface of the substrate, and a supporter 68 is pasted on the front surface of the substrate. Then, the second dry etching process is performed from the back surface of the substrate. The second dry etching process can be the isotropic dry etching process. The second dry etching process can etch the substrate 61 to a certain depth but does not penetrate the substrate 61. If the second dry etching process penetrates the substrate to reach the aperture area 65, the devices will come apart, or the relative position of the semiconductor device (the chip) is shifted to cause deficiencies in the following wafer level processes. The second dry etching process widens the hollow portion 66 to a position 67b which is further horizontally extended from an edge position 67a of the aperture area 65. The position 67b is an edge, facing the aperture area, of the silicon substrate 61 in contact with the masking material layer 69.

Subsequently, a sidewall, made by the first dry etching process, of the aperture area 65 on the front surface of the substrate is coated with an etching mask, and a chip fixation sheet 70 is pasted on the back surface of the substrate. Then, the third dry etching process is performed from the front surface of the wafer. The third dry etching process can be the anisotropic dry etching process, and the third dry etching process can be self-aligned with the etching mask coating the sidewall of the aperture area 65.

In the manufacturing method according to the fourth embodiment, the dry etching process is performed from both the front surface and the back surface of the substrate to better reduces influence of the horizontal extension of etching processes on the area of the devices.

Fifth Embodiment

Figure 13:
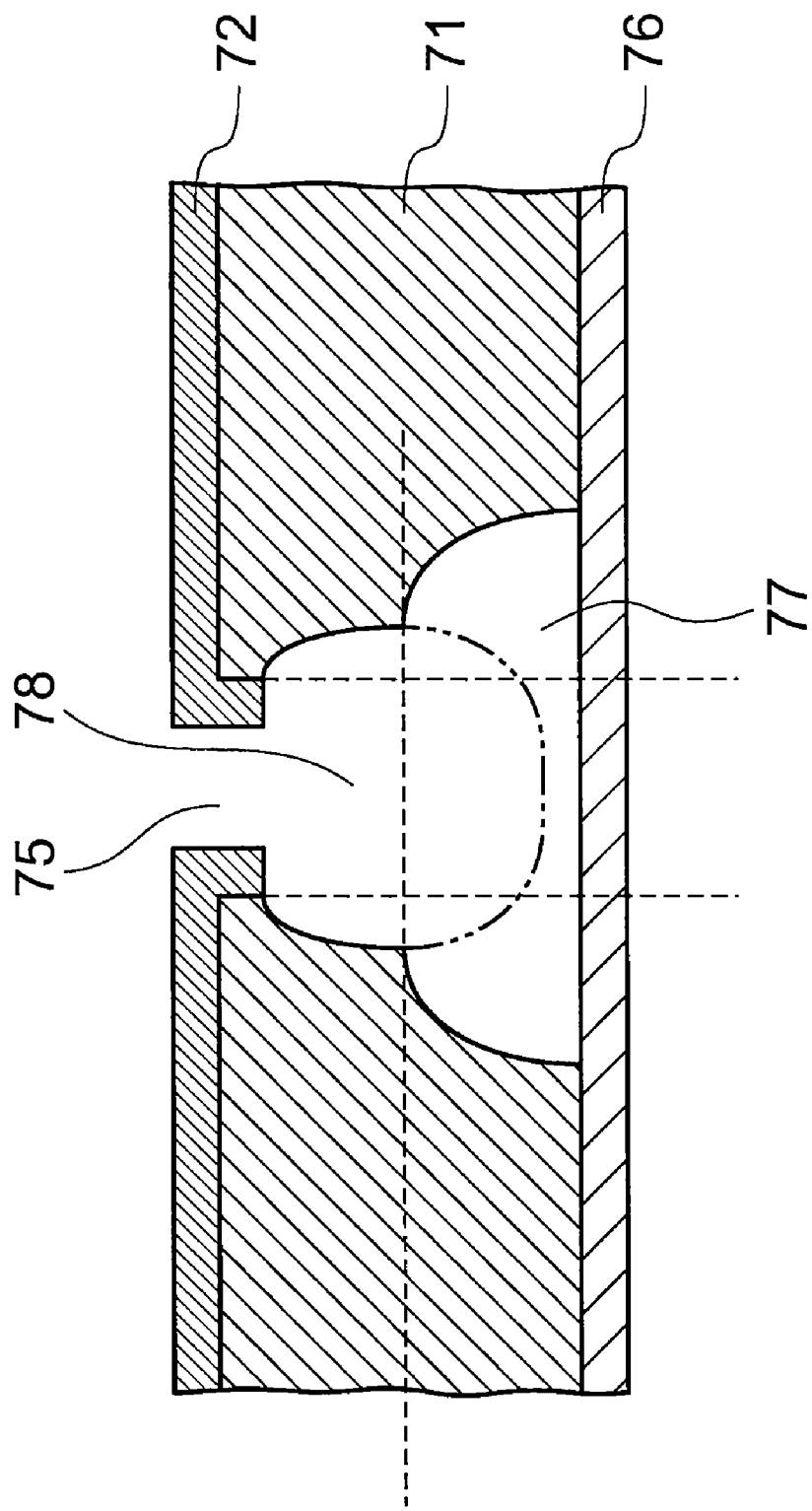
FIG. 13 is a cross section of the wafer according to the manufacturing method of the semiconductor device of the fifth embodiment of this invention.
Figure 16:
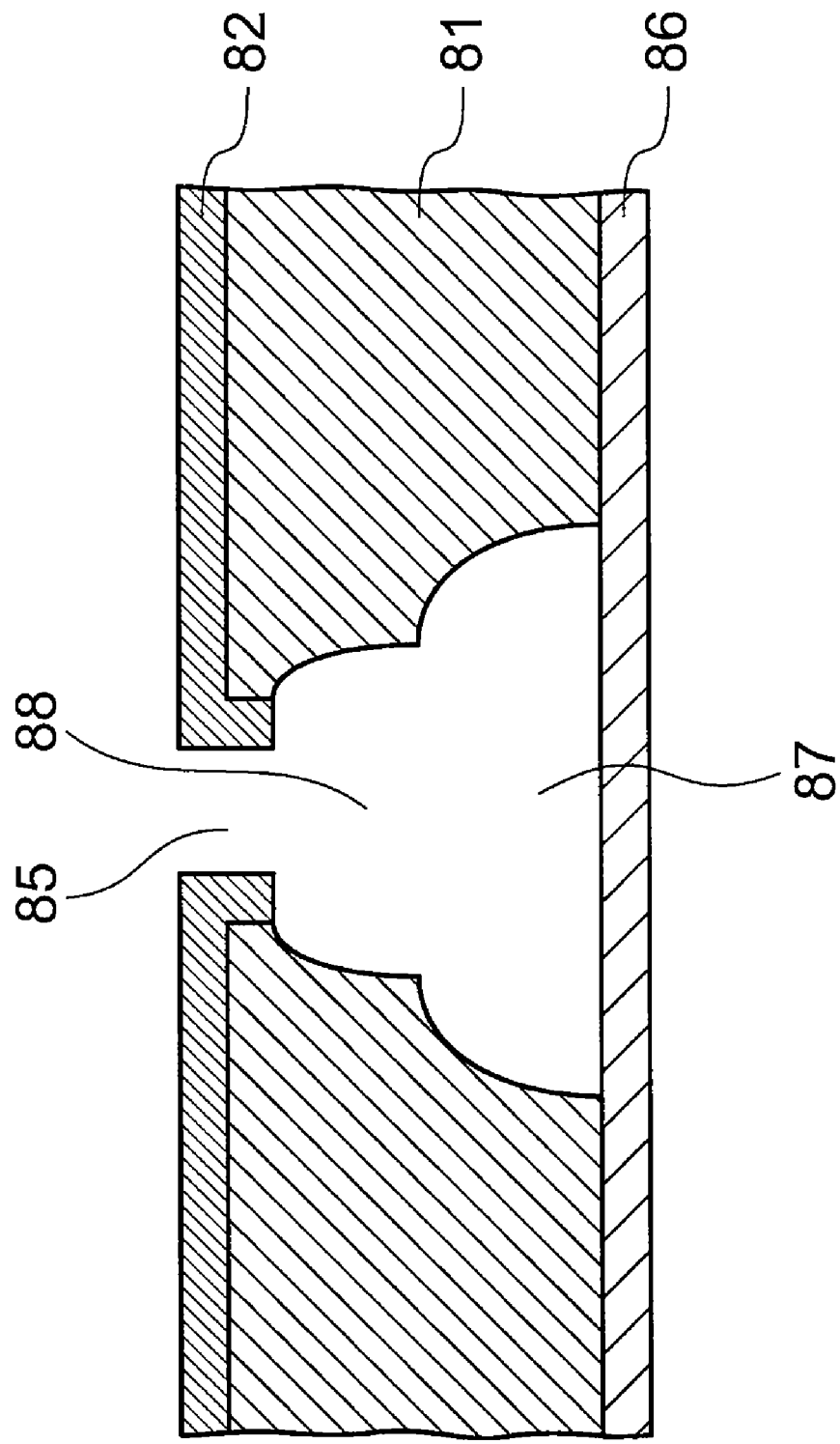
FIG. 16 is a cross section of the wafer after the third etching process has been performed according to the manufacturing method of the semiconductor device of the fifth embodiment of this invention.

FIG. 13 and FIG. 16 are cross sections showing steps of the manufacturing method of the semiconductor device according to the fifth embodiment of this invention. As shown in FIG. 13, an adhesive sheet 76 as a supporter is pasted to the back surface of a silicon substrate 71, and a masking material layer 72 is formed on the front surface thereof. The anisotropic etching process (the first etching process), the isotropic etching process (the second etching process), and another isotropic etching process (the third etching process), each of which is of a different condition, are performed through an aperture area 75 of the masking material layer 72 to form a hollow portion 77 in a shape extending in two steps. Therefore, it can be configured to have the latter isotropic etching process (the third etching process) etch the substrate faster than the former isotropic etching process (the second etching process) to improve the overall etching rate while preventing the device area from being adversely affected by the horizontal etching.

Figure 14:
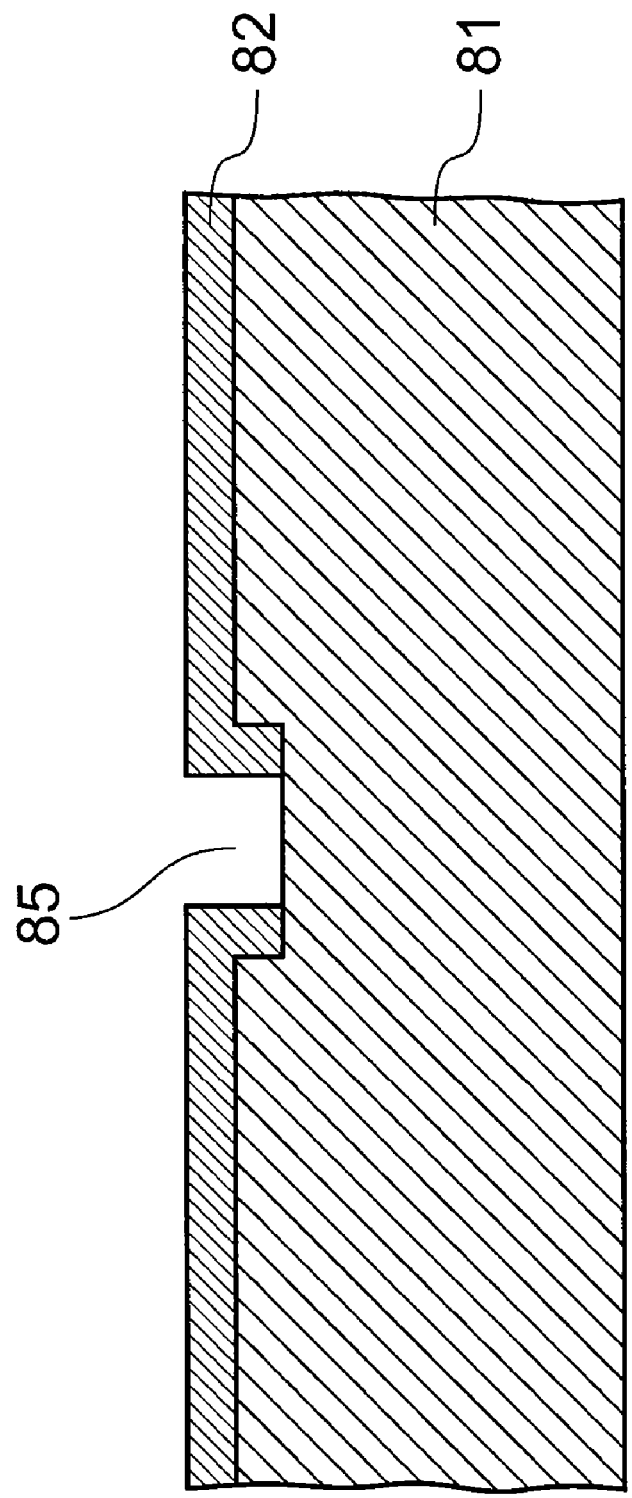
FIG. 14 is a cross section of the wafer after the first etching process has been performed according to the manufacturing method of the semiconductor device of the fifth embodiment of this invention.

The fifth embodiment will be hereinafter described with reference to FIG. 14 through FIG. 16. First, as shown in FIG. 14, a masking material layer 82 is formed on the front surface of a substrate 81. Then, the anisotropic dry etching process etches the substrate to form a first aperture area 85 with the use of the masking material layer 82. Subsequently, a sidewall of the first aperture area 85 is masked with the masking material.

Figure 15:
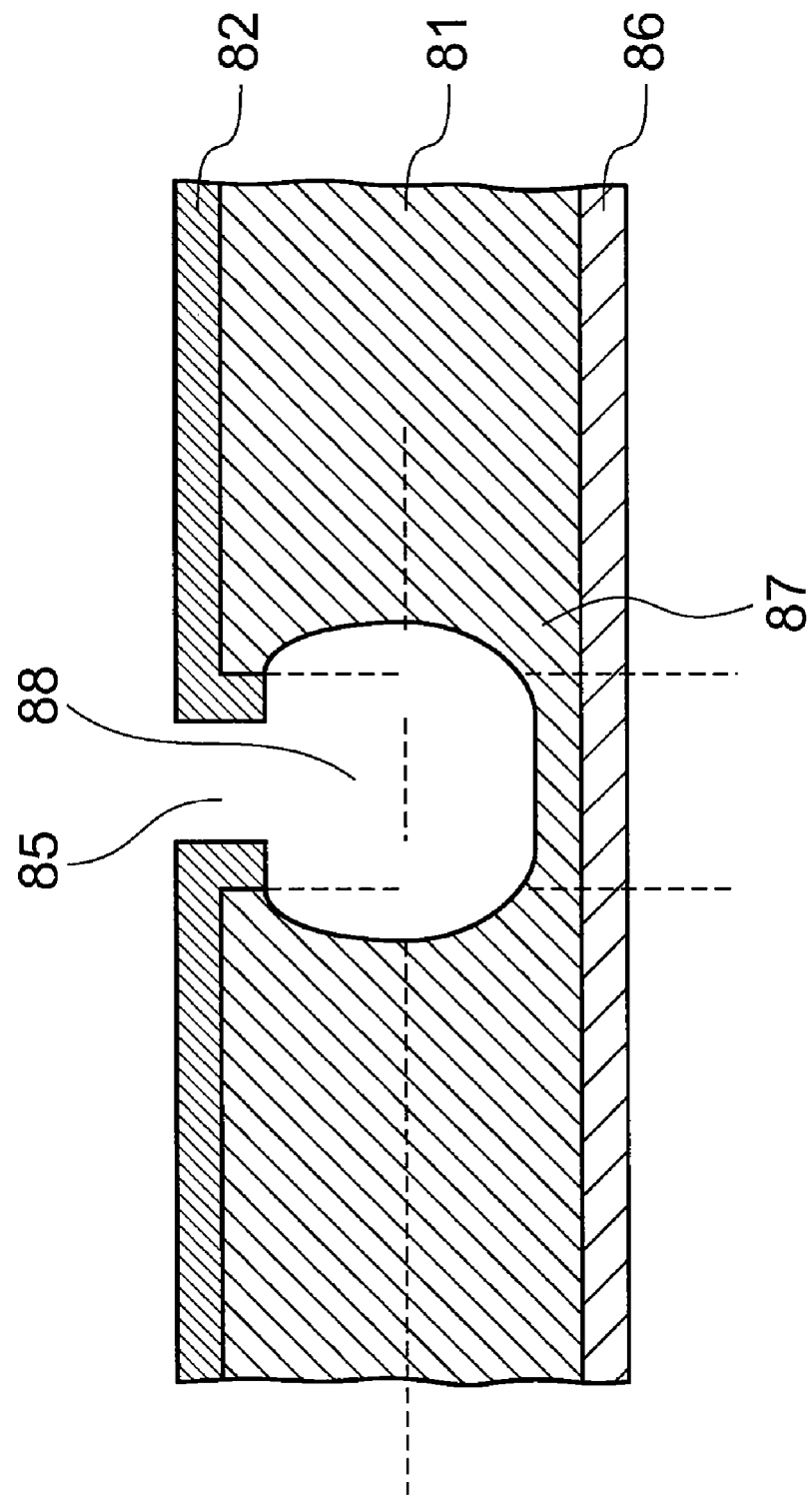
FIG. 15 is a cross section of the wafer after the second etching process has been performed according to the manufacturing method of the semiconductor device of the fifth embodiment of this invention.

Subsequently, as shown in FIG. 15, a second dry etching process is performed from the front surface of the substrate after a chip fixation sheet 86 is formed on the back surface of the substrate 81. The second dry etching process employs a condition that widens a hollow portion 88 in a horizontal direction more than the first dry etching process but that has a lower etching rate than a general isotropic etching process to restrict etching in a horizontal direction. The second dry etching process uses, for example, an etching gas including $SF_6$ and $O_2$ and including more $O_2$ than $SF_6$. The second dry etching process etches the substrate 81 to a certain depth but does not penetrate the substrate 81.

Subsequently, a third dry etching process is performed from the front surface of the substrate 81. The third dry etching process employs the isotropic etching process. A horizontal expansion of the hollow portion 87 near the bottom of the substrate is tolerated in the third dry etching process. As shown in FIG. 16, a space etched by the third dry etching process is made to be wider than a space etched by the second dry etching process in a horizontal direction. The third dry etching process uses, for example, an etching gas including $SF_6$ and $O_2$ and including more $SF_6$ than $O_2$.

In the manufacturing method according to the fifth embodiment, the second dry etching process is performed under a condition that a horizontal etching amount thereof is greater than the first dry etching process but less than the isotropic etching process in general, and the third dry etching process is the isotropic etching process. Therefore, the fifth embodiment is advantageous in capable of not only preventing the device areas from being adversely affected by the etching in a horizontal (lateral) direction but also improving the etching ratio. The third dry etching may also be performed from the back surface of the wafer. A method described in the third embodiment can be employed to perform the etching from the back surface of the wafer.

As an example of the semiconductor apparatus manufactured according to the manufacturing method as described above, a light emitting diode (LED) print head will be hereinafter described with reference to FIG. 17.

Figure 17:
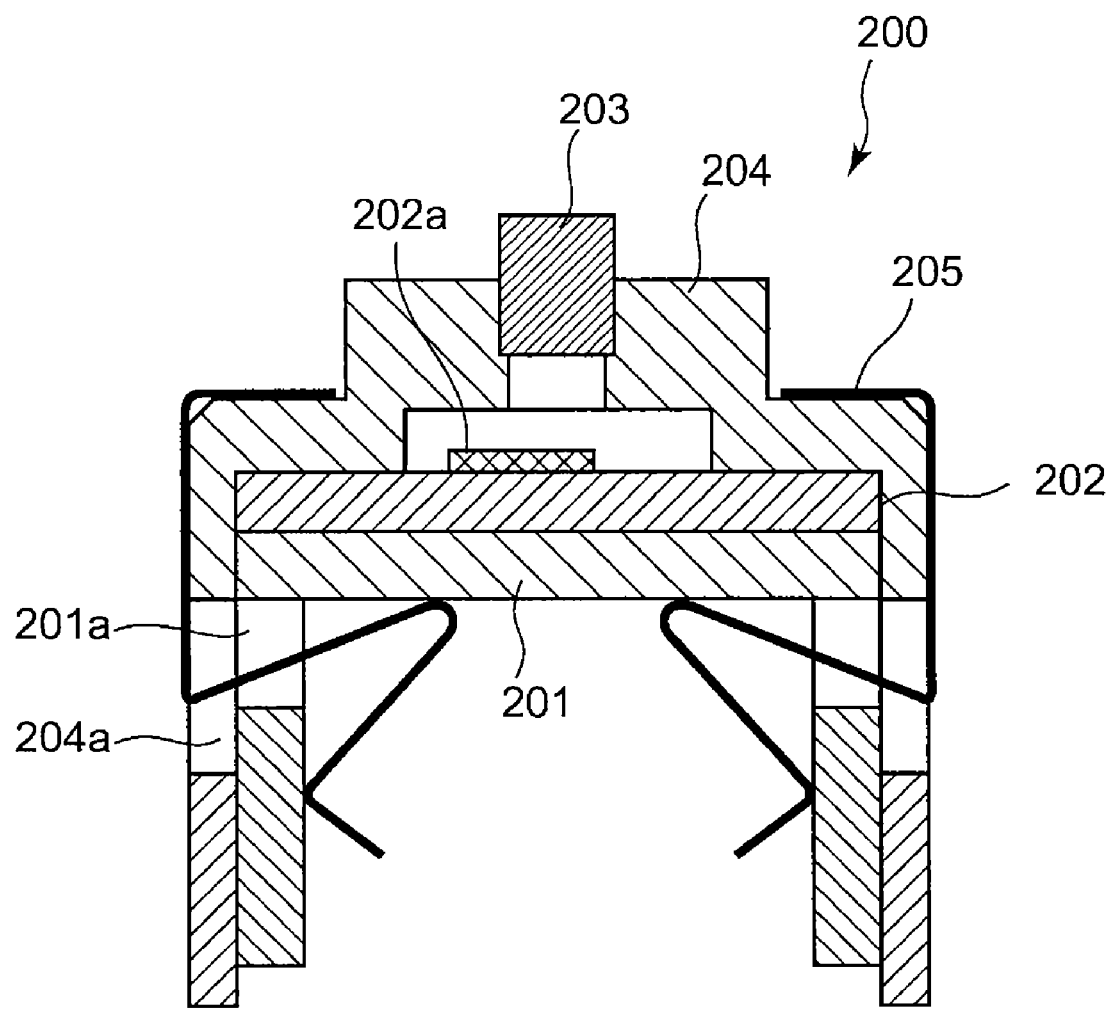
FIG. 17 is a diagram showing an embodiment of an LED print head according to this invention.
Figure 18:
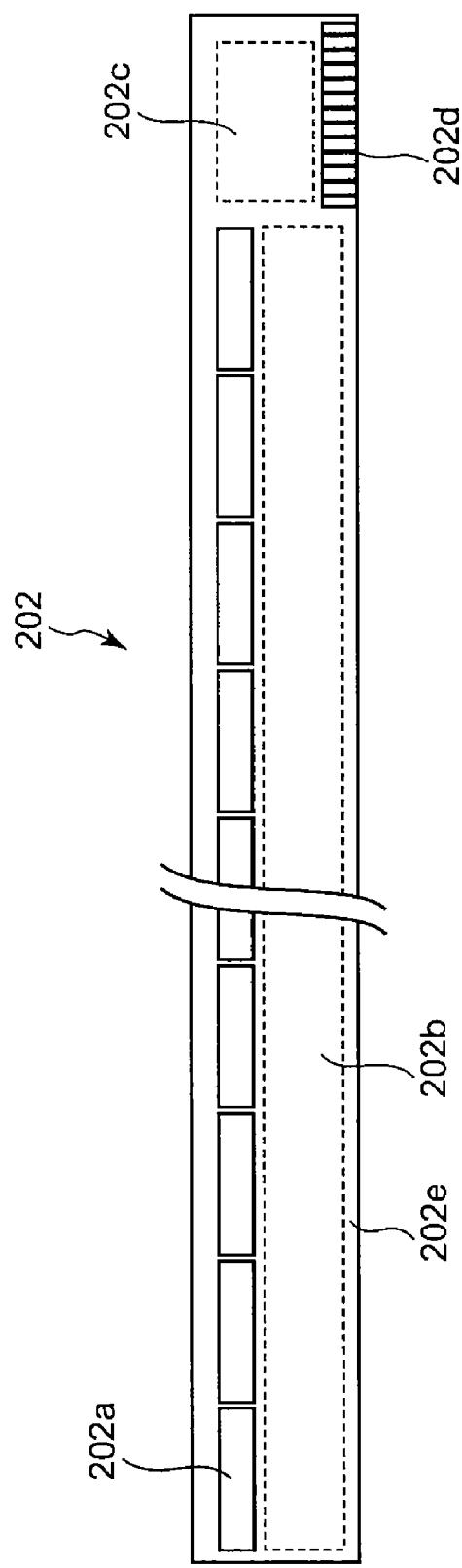
FIG. 18 is a top view showing an exemplary structure of the LED print head according to this invention.

FIG. 17 is a figure showing an LED print head 200 according to an embodiment of LED array chips of the present invention. As shown in FIG. 17, an LED array unit 202 is arranged on a base material 201. The LED array unit 202 is manufactured with the semiconductor devices formed according to any one of the first through fifth embodiments and arranged on a mounting substrate. Thin film LED's are bonded and disposed in a row on the Si substrate to form LED array chips. FIG. 18 is a top view showing a configuration example of the LED array unit 202. On a mounting substrate 202e, the semiconductor device chips described in the above embodiments are arranged as an LED array 202a in a longitudinal direction. Furthermore, on the mounting substrate 202e, arranged are units such as, e.g., an electric component mounting area 202b and 202c on which electric components and wirings are formed and a connector 202d for providing control signal and power source received from outside.

A rod lens array 203 as an optical element for focusing light emitted from the LED array is arranged above the LED array 202a. The rod lens array 203 is formed by arranging many columnar optical lenses arranged linearly along the light emitting unit, and is held at a prescribed position by a lens holder 204 corresponding to an optical element holder.

The lens holder 204 is formed to cover the base material 201 and the LED unit 202 as shown in FIG. 17. The base material 201, the LED unit 202, and the lens holder 204 are collectively held by a damper 205 arranged through an aperture area 201a, 204a formed on the base material 201 and the lens holder 204. Thus, a light emitted from the LED unit 202 passes through the rod lens array 203 and irradiates a prescribed external photosensitive drum. The LED print head 200 is used as, for example, an exposure device of an electrophotographic printer, electrophotographic copying machine, and the like.

As hereinabove described, the LED print head according to the present embodiment employs any one of the semiconductor devices described in the aforementioned embodiments, and thus, a high quality and reliable LED print head is provided.

Figure 19:
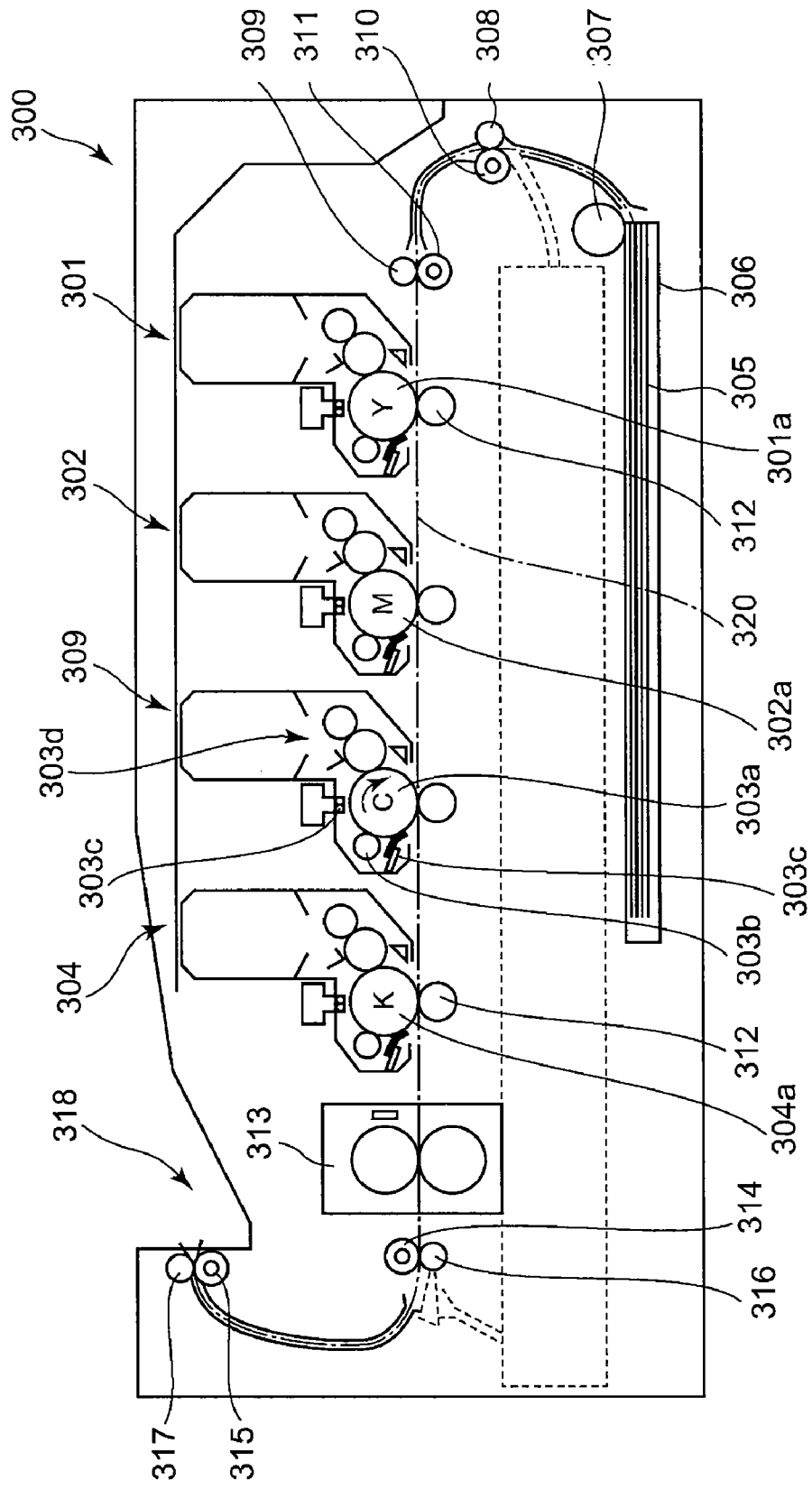
FIG. 19 is a diagram showing an essential portion of an embodiment of an image forming apparatus according to this invention.

FIG. 19 is a figure showing a structure of an essential portion of an image forming apparatus 300 according to an embodiment of an image forming apparatus of the present invention. As shown in FIG. 19, four process units, namely, a process unit 301, 302, 303, and 304, respectively forming images of yellow, magenta, cyan, and black, are respectively arranged from upstream along a conveyance route 320 for a recording medium 305 in the image forming apparatus 300. Since the process unit 301, 302, 303, and 304 has the same interior structure, only the process unit 303 will be hereinbelow described as an example.

The process unit has a photosensitive drum 303a as an image carrier arranged rotatably in a direction indicated by an arrow. A charging unit 303b for charging the surface of the photosensitive drum 303a by providing the electricity thereto and an exposure unit 303c for forming electrostatic latent images by selectively irradiating light to the surface of the charged photosensitive drum 303a are arranged from upstream in the direction of rotation around the photosensitive drum 303a. Furthermore, a developing unit 303d for generating a toner image by applying a toner in a prescribed color, namely, cyan in the present unit, and a cleaning unit 303e for removing a residual toner on the surface of the photosensitive drum 303a are arranged around the photosensitive drum 303a. The drum and rollers used in each unit are driven in synchronization by a driving source and gears, not shown.

On the bottom of the image forming apparatus 300, there is a paper cassette 306 for containing a recording medium 305 such as, e.g., paper in a stacked state. Above the paper cassette 306, arranged is a hopping roller 307 for separating, sheet by sheet, and conveying the recording medium 305. On downstream of the hopping roller 307 in a conveyance direction of the recording medium 305, a resist roller 316 and 311 are arranged to correct skew and convey the recording medium to the process unit 301, 302, 303, and 304 by sandwiching the recording medium 305 with a pinch roller 308 and 309. The hopping roller 307, the resist roller 310, and 311 are driven in synchronization by a driving source and gears, not shown.

On the opposite of the respective photosensitive drum of the process unit 301, 302, 303, and 304, arranged are transfer rollers 312 made of a semiconductor rubber and the like. In order to cause the toners on the photosensitive drum 301a, 302a, 303a, and 304a to adhere to the recording medium 305, a prescribed potential difference is generated between the surface of the photosensitive drum 301a, 302a, 303a, and 304a and the surface of each of the transfer rollers 312.

A fusing unit 313 has a heating roller and a backup roller, and pressurizes and heats the toners on the recording medium 305 to fix the toners. A discharging roller 314 and 315 deliver the recording medium 305 discharged by the fusing unit 313 to a recording medium stacker unit 318 by sandwiching the recording medium with a pinch roller 316 and 317. The discharging roller 314 and 315 are driven in synchronization by a driving source and gears, not shown. The LED print head 200 previously described is used as the exposure unit 303c.

Subsequently, operation of the image forming apparatus is hereinafter described. First, the hopping roller 307 separates, from the top, sheet by sheet, the recording medium 305 stacked and contained in the paper container 306 and convey the separated recording medium 305. Subsequently, the resist roller 310 and 311 and the pinch roller 308 and 309 sandwich and convey the recording medium 305 to the photosensitive drum 301a and the transfer roller 312 of the process unit 301. Subsequently, the photosensitive drum 301a and the transfer roller 312 sandwich the recording medium 305 to transfer a toner image to the surface of the recording medium and, at the same time, convey the recording medium by the rotation of the photosensitive drum 301a.

In a similar manner, a recording medium 305 passes through the process unit 302, 303, and 304 in sequence so that toner images of each color developed by the developing unit 301d, 302d, 303d and 304d based on electrostatic latent images formed by the exposure unit 301c, 302c, 303c, and 304c are transferred in sequence onto the surface of the recording medium 305 as overlapped. After the toner images of each color are overlapped on the surface of the recording medium 305, the fusing unit 313 fuses the recording medium 305 having the toner images on the surface, and the discharging roller 314 and 315 and the pinch roller 316 and 317 sandwich and delivers the recording medium 305 to the recording medium stacker unit 318 on the outside of the image forming apparatus 300. A color image is formed on the recording medium 305 through the above mentioned processes.

As hereinabove described, the image forming apparatus according to the present embodiment employs the LED print head described in the aforementioned embodiment, and thus, a high quality and reliable image forming apparatus is provided.

Although a light emitting device (LED) is described as an example of semiconductor device formed in the semiconductor element area of the semiconductor device in the above embodiments, this invention is not limited thereto. Obvious modifications will occur to those skilled in the art. For example, a photoreceptive element may be formed in place of the light emitting element, or various other semiconductor elements may be formed other than such light related elements.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A manufacturing method of a semiconductor device in which a first substrate comprising a semiconductor element area is divided into a plurality of semiconductor devices, the manufacturing method comprising steps of:
   performing a first etching process to etch a separation area on a front surface of the first substrate;
   arranging a supporter on a back surface of the first substrate to prevent each of the plurality of semiconductor devices from coming apart after the first substrate is divided;
   coating a non-etching area, including a sidewall of the etched separation area and excluding an aperture area on a bottom of the etched separation area, on the front surface of the first substrate with a thin film; and
   performing a second etching process to etch the first substrate from the front surface through the aperture area as an etching window so as to penetrate the first substrate;
   wherein the first etching process is an anisotropic etching process and the second etching process is an isotropic etching process.

2. The manufacturing method of the semiconductor device according to claim 1, wherein the first substrate is a semiconductor substrate.

3. The manufacturing method of the semiconductor device according to claim 2, wherein the semiconductor substrate is a silicon substrate.

4. The manufacturing method of the semiconductor device according to claim 1, wherein the thin film comprises a silicon oxide or a silicon nitride.

5. The manufacturing method of the semiconductor device according to claim 1, wherein the thin film is made of an organic material.

6. A semiconductor manufacturing equipment for dividing a first substrate comprising a semiconductor element area into a plurality of semiconductor devices, wherein the semiconductor manufacturing equipment performs the manufacturing method according to claim 1.

7. A light emitting diode head comprising a semiconductor light emitting element area arranged on a first substrate, wherein the manufacturing method according to claim 1 is performed to separate the light emitting diode head from another neighboring light emitting diode head.

8. An image forming apparatus comprising the light emitting diode head according to claim 7.

* * * * *